United States Patent
Costard et al.

[11] Patent Number: 6,091,126
[45] Date of Patent: Jul. 18, 2000

[54] ELECTROMAGNETIC WAVE DETECTOR

[75] Inventors: Eric Costard, Massy; Philippe Bois, Cesson; Eric Herniou, Les Essarts le Roi; Marcel Audier, Paris, all of France

[73] Assignee: Thomson-CSF, Paris, France

[21] Appl. No.: 08/984,944

[22] Filed: Dec. 4, 1997

[30] Foreign Application Priority Data

Dec. 4, 1996 [FR] France .................................. 96 14851

[51] Int. Cl.⁷ ...................... H01L 27/14; H01L 31/0232; H01L 31/00
[52] U.S. Cl. .......................... 257/431; 257/436; 257/443
[58] Field of Search .............................. 257/184, 15, 431, 257/21, 435, 436, 443, 440, 777, 292; 356/141.2

[56] References Cited

U.S. PATENT DOCUMENTS

| | | | |
|---|---|---|---|
| 5,086,327 | 2/1992 | Rosencher et al. | 257/184 |
| 5,187,715 | 2/1993 | Weisbuch et al. | 257/184 |
| 5,228,777 | 7/1993 | Rosencher et al. | 257/184 |
| 5,326,984 | 7/1994 | Rosencher et al. | 257/184 |
| 5,506,418 | 4/1996 | Bois et al. | 257/15 |
| 5,552,603 | 9/1996 | Stokes | 257/440 |
| 5,677,544 | 10/1997 | Duboz et al. | 257/21 |
| 5,712,499 | 1/1998 | Duboz et al. | 257/292 |
| 5,719,670 | 2/1998 | Duboz et al. | 356/141.2 |
| 5,726,500 | 3/1998 | Duboz et al. | 257/777 |
| 5,731,621 | 3/1998 | Kosai | 257/443 |

FOREIGN PATENT DOCUMENTS

| | | | |
|---|---|---|---|
| 0 345 972 | 12/1989 | European Pat. Off. | 257/440 |
| 0 481 552 | 4/1992 | European Pat. Off. | 257/440 |
| 61-93923 | 5/1986 | Japan | 257/431 |

*Primary Examiner*—Steven H. Loke
*Attorney, Agent, or Firm*—Oblon, Spivak, McClelland, Maier & Neustadt, P.C.

[57] ABSTRACT

An electromagnetic wave detector having a first detector element including an active photoconducting material capable of detecting a band of wavelength and a second detector element including an active photoconducting material capable of detecting the same band of wavelength. A common layer is positioned between the first and second detector elements. A first and second connectors are configured to connect to the first and second detector elements, respectively. A third connector is configured to connect in common to the first and second detector elements. The detector further includes contact mechanisms configured to apply control voltages where the voltage applied to the third connector has a value between the values applied to the first and second connectors. A reading circuit connected to the third connector reads a photoconduction current difference between the first and the second detector elements. The applied control voltages are adjusted voltages such that the dark currents or the sums of the dark currents and the background light-currents generated in the two detector elements are equal.

11 Claims, 8 Drawing Sheets

ELECTROMAGNETIC WAVE DETECTOR

BACKGROUND OF THE INVENTION

The invention relates to an electromagnetic wave detector, notably a detector making use of photoconduction.

More particularly, the invention relates to detector architecture that enables elimination of the dark current and the background light-current upstream of the reading circuit.

DESCRIPTION OF THE PRIOR ART

The dark current and background light-current limit the dynamic response and the range of operating temperatures of matricial and hybrid-type infrared photoelectric detection systems based on silicon circuits. For each pixel of the active detection matrix there is an integration and reading circuit on the silicon chip. As the format of the matrix increases, the surface available per pixel for the reading circuit, and the storage capacity in particular, decrease (the surface available for the reading circuit of a pixel of a matrix whose format exceeds $256^2$ is less than $30 \times 30\ \mu m^2$). The background and dark currents generate an offset that limits the capacity of storage of the incident signal. The dark current varies exponentially with the temperature of operation of the detection matrix. The operation of the silicon reading circuit generates noise which adversely affects the storage capacity.

SUMMARY OF THE INVENTION

The invention concerns a photoconductor-based electromagnetic wave detector including:

- at least two overlaid plane active photoconducting detector elements separated by a common layer;
- a first means of connection connected in common to the said detector elements, a second means of connection connected to the first detector element, and a third means of connection connected to the second detector element;
- means for applying control voltages to each of said means of connection, the voltage applied to the first means of connection having a value between the ones applied to the second and third means of connection;
- means connected to said first means of connection to detect the difference of the photoconduction currents of said detector elements.

BRIEF DESCRIPTION OF THE DRAWINGS

Other characteristics and advantages of the present invention will become apparent on read the following description of a preferred embodiment, with reference to the attached drawings.

DESCRIPTION OF THE PREFERRED EMBODIMENT

Figure 1A:
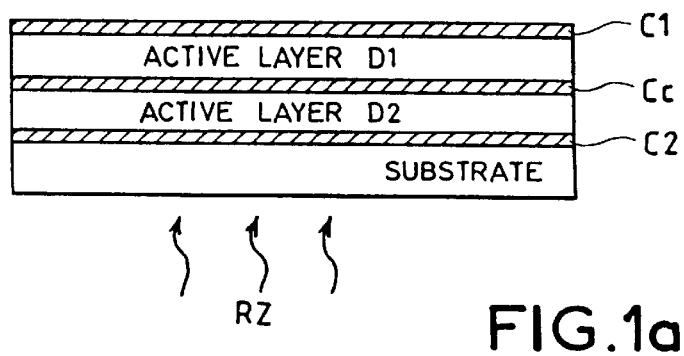
FIG. 1*a* shows a simplified example of the detector according to the invention.

As shown in the simplified diagram in FIG. 1*a*, the detector according to the invention includes, overlaid on a substrate:

a contact layer C2
an active photoconducting layer D2
a common contact layer Cc
an active photoconducting layer D1
and a contact layer C1

The active photoconducting layers D1, D2 can be layers of photoconducting semiconductor such as silicon. They can be also made in the form of a stack of layers constituting of the quantum-well detectors. The two active layers D1, D2 are photoconducting at the same wavelength λ. One of the active layers is highly absorbent at wavelength λ, whereas the other layer offers little or no absorption. This condition can be achieved by using different thicknesses of the active layers, or by heavier doping of the quantum-well layers of the more absorbent active layer.

Figure 2:
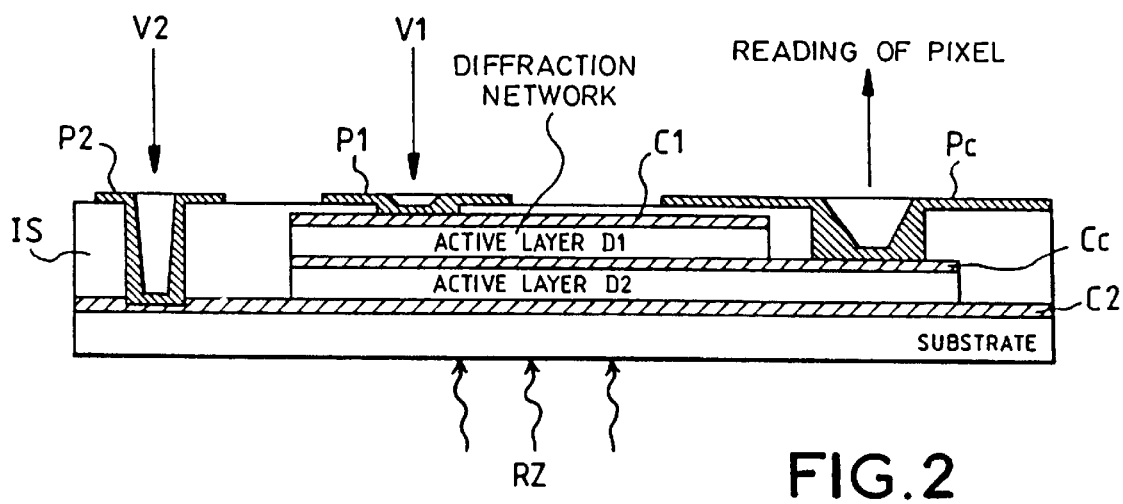
FIG. 2 shows details of an embodiment of the detector according to the invention.

The detector being illuminated by the radiation RZ as shown in FIGS. 1*a* and 2, the active layer D2 receives the radiation first.

In the case where layer D1 is more absorbent than layer D2, we can provide a diffraction network on the face of the layer D1 that is in contact with the contact layer C1. This network receives the light that is not absorbed when traversing the layer D1 and diffracts it towards the layer D1 where the diffracted light will be fully or almost fully absorbed.

In the case where layer D2 has a significantly greater response than that of layer D1, it absorbs almost all radiation at the wavelength in question. In addition, the layer Cc can be provided to block the wavelength λ; this layer can be for example metallic or a semiconductor that blocks the wavelength λ.

The contact layers C1 and C2 enable control voltages to be applied. The contact layer Cc is common to the two detector elements comprised of active photoconducting layers. It is held at a reference voltage and enables the detection of the photocurrents generated by the detectors D1, D2.

FIG. 2 shows a more detailed embodiment of the detector according to the invention in which the detector is encapsulated in an insulating material IS. The connection terminals P1, P2, Pc traverse this insulator and enable contacts to be made on the contact layers C1, C2, Cc respectively.

The substrate is transparent to the wavelengths to be measured, so the detector receives the radiation RZ to be detected through the substrate.

When radiation RZ is received by the detector, to detect the wavelength λ (or band of wavelengths), we apply:

a voltage V1 to the contact layer C1
a voltage V2 to the contact layer C2
a floating voltage Vc (or ground) between V1 and V2 to the common contact layer Cc.

The currents flowing in the structures D1 and D2 are respectively:

$$I1 = I1d + I1opt$$
$$I2 = I2d + I2opt$$

The currents I1d and I2d are the dark currents in D1 and D2. The currents I1d and I2d can also represent the sum of a dark current and a background light-current. The currents I1opt and I2opt are the photocurrents generated by the wavelength λ to be detected in D1 and D2.

Figure 1B:
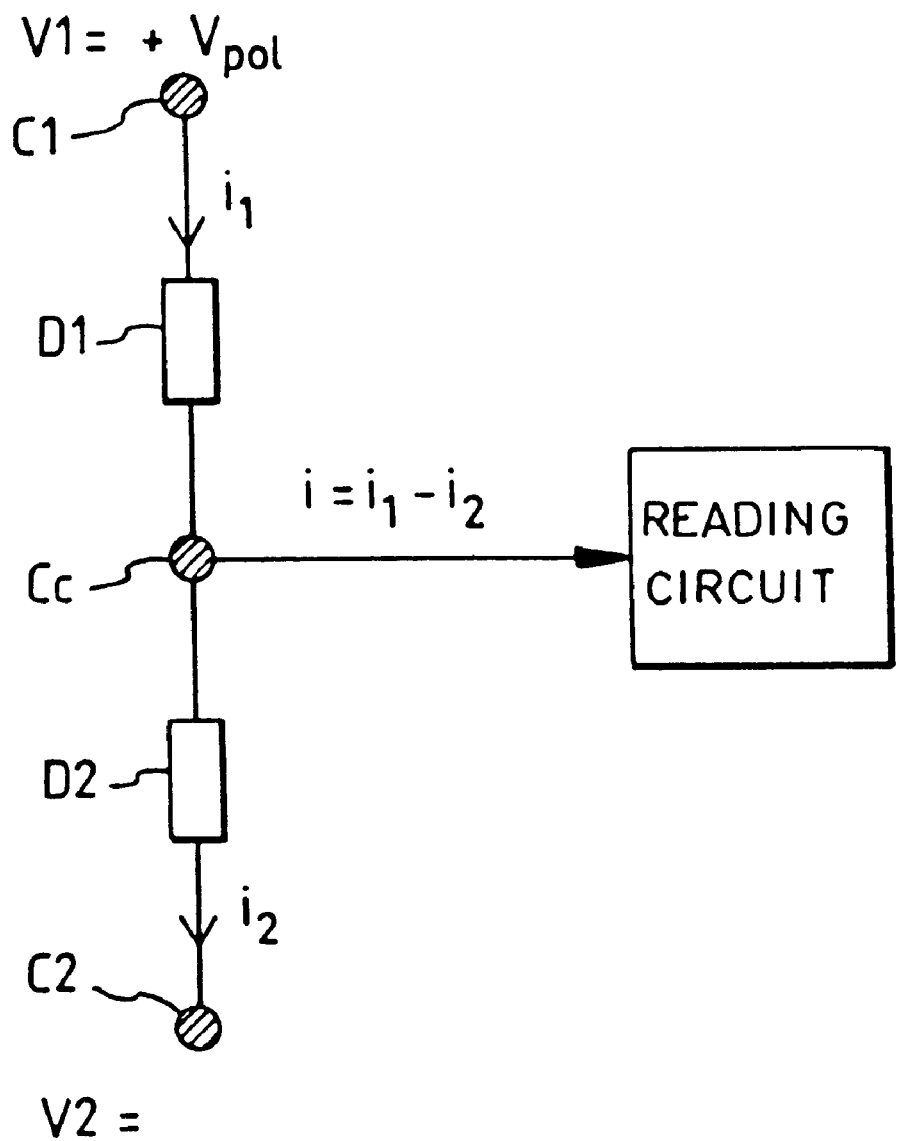
FIG. 1*b* shows an electric circuit used with the detector in FIG. 1.

We see in FIG. 1*b* that the current i collected by the reading circuit is:

$$I = I1 - I2$$

By adjusting the voltage V1 and/or V2, it is possible to make I1d=I2d, in which case the value of the detected current is:

I=I1opt−I2opt

By ensuring that one of the two active layers absorbs only very little of the energy at wavelength λ, the current I is therefore that generated by the active layer having the higher response.

Figure 3A:
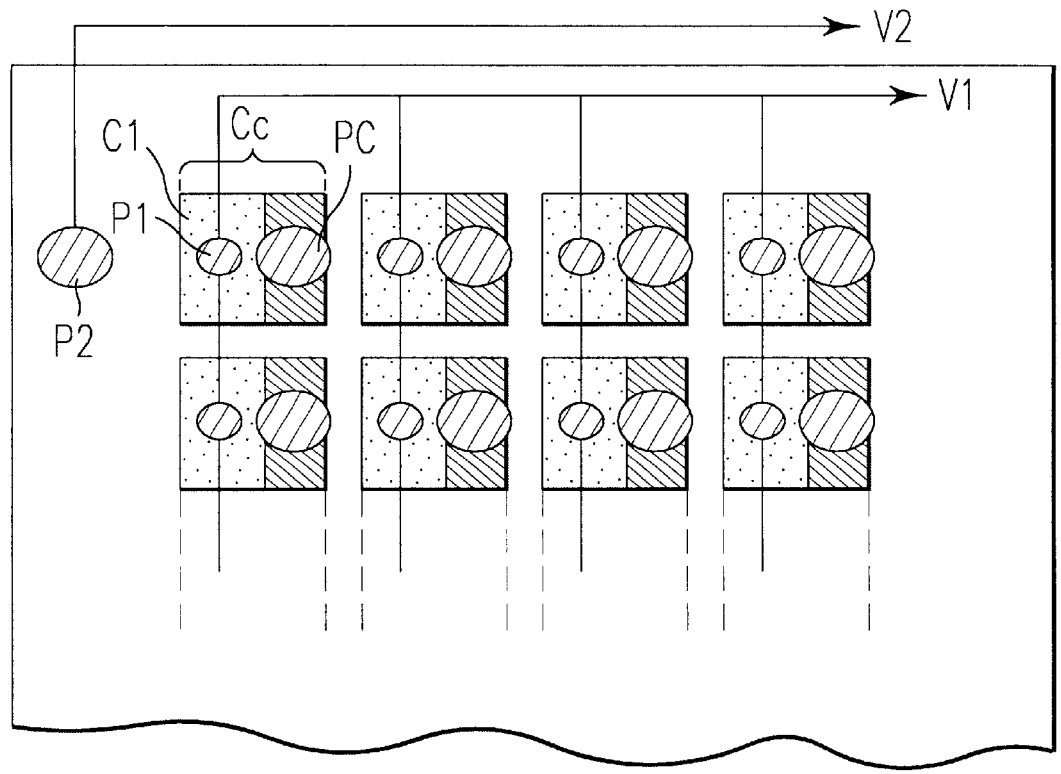
FIGS. 3*a* and 3*c* show plan views and 3*b* shows and a sectional view of a matrix of detectors according to the invention.
Figure 3B:
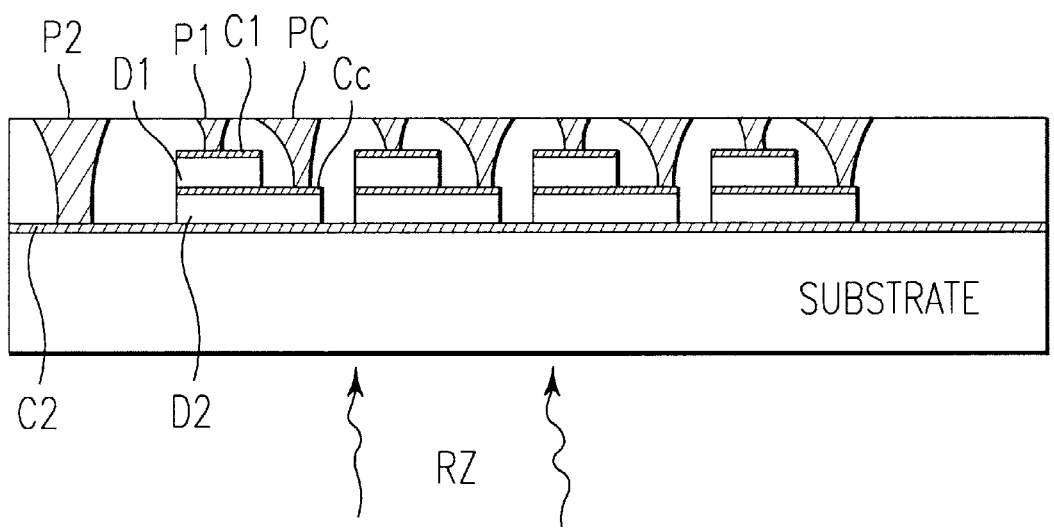

FIGS. 3a and 3b show a plan view and a sectional view of a matricial embodiment of a detector according to the invention.

The detectors of the matrix are made on a control contact layer C2 common to all the detectors. The connection terminal P2 is therefore common to the whole matrix. Each detector includes a detector element D1, a detector element D2, the contact layers C1 and Cc and the connection terminals P1 and Pc. The connection terminals P1 are all connected together to apply a voltage V1 (see earlier) to all the detector elements D1 of the matrix. The contact layer C2 and the connection terminal P2 being common to the whole matrix, the potential applied to the terminal P2 is applied to all the detector elements D2 of the matrix.

Figure 3C:
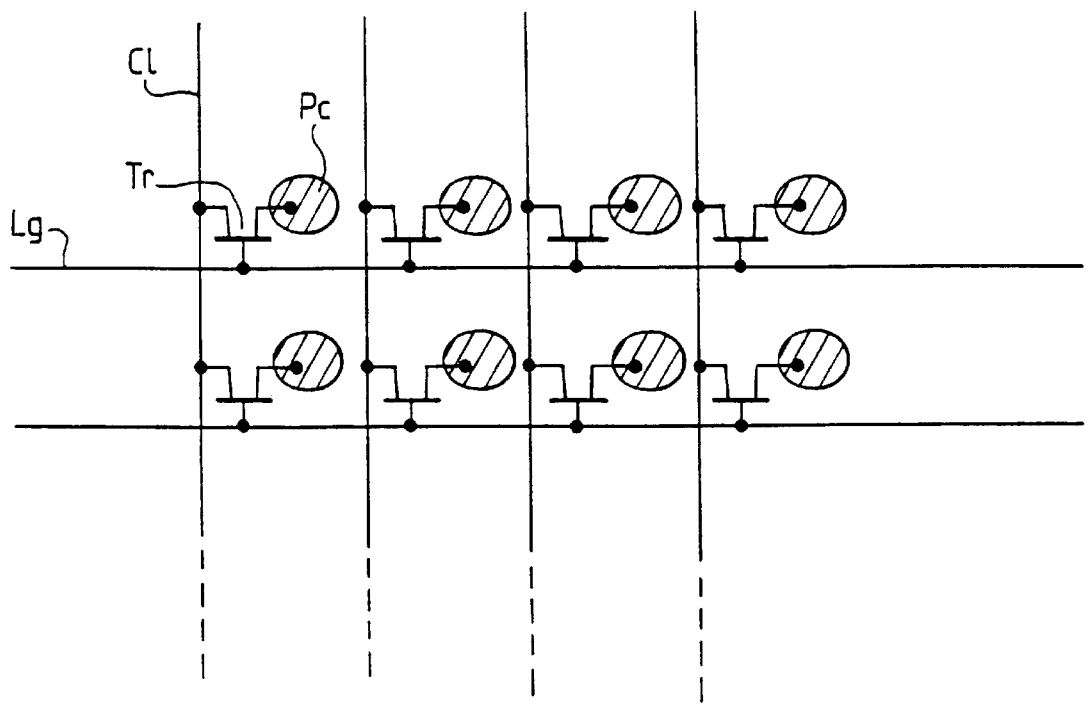

To enable reading of the detectors of the matrix, each detector is located at the intersection of a network of line and column conductors. In FIG. 3c, we have shown only the connection terminal Pc of each detector. Each intersection is equipped with, a switching device for example, a transistor Tr whose base is connected to the line wire Lg. The emitter and the collector are connected respectively to a terminal Pc and a column wire C1. By applying a suitable potential to a line wire we can control all the transistors of the line and connect all the terminals Pc of a line to column wires. It is therefore possible to read on each column wire the photocurrent generated by the detector connected to this column wire.

In this embodiment, all the layers C1 are interconnected and held at the same potential. The same applies to the contacts C2 that are connected to the terminal P2.

In a variant of the embodiment, the control contact layer C2 is cut into strips such that each strip is common to a line of detectors. We then have one terminal P2 per contact strip C2, i.e. per line of detectors.

In a similar manner, instead of interconnecting all the terminals P1, we can interconnect them in lines of detectors, in which case we have one terminal P1 per line of detectors.

The terminals Pc of the detectors are interconnected by the column wires of the matrix. The operation of the matrix of detectors is then sequential by line.

Figure 4A:
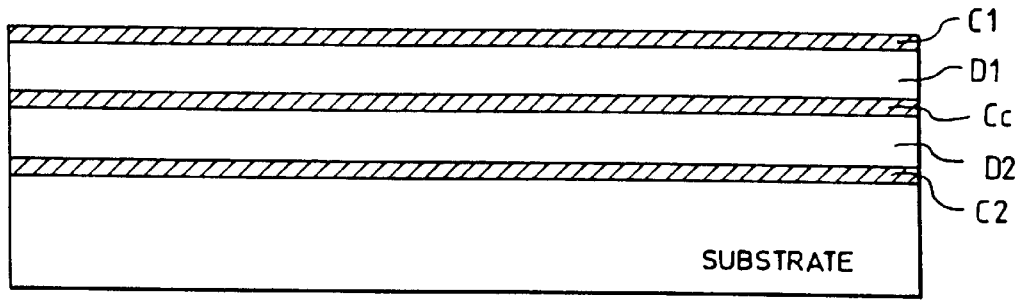
FIGS. 4*a* to 4*c* show example of a method of fabrication of the detector according to the invention.
Figure 4B:
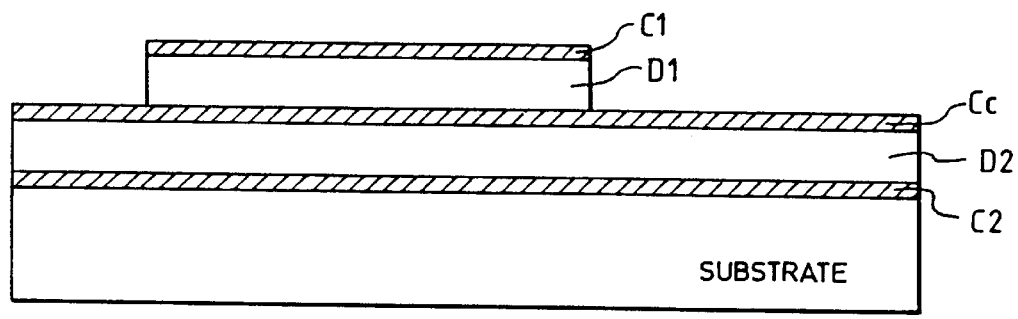
Figure 4C:
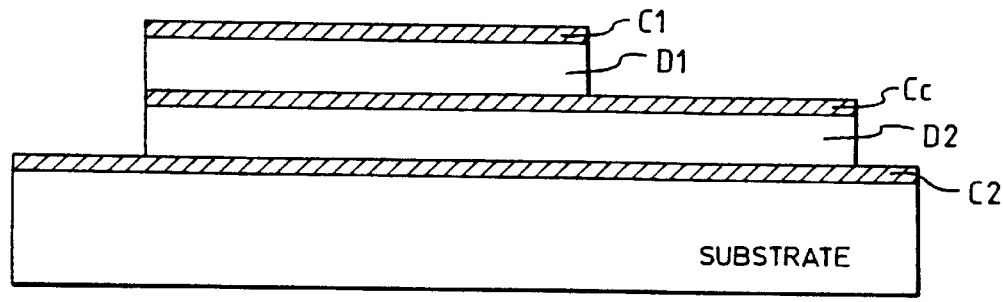

We shall now describe a method of fabrication of a detector according to the invention, with reference to FIGS. 4a to 4c.

On a substrate of material transparent to the wavelengths to be detected, we successively make a contact layer C2, one or more photoconducting layers D2 constituting the photodetector element D2, a common contact layer Cc, one or more photoconducting layers D1 constituting the photodetector element D1, and a contact layer C1 (FIG. 4a).

The upper detector element D1 is formed by engraving of the layers C1 and D1; the engraving stops at the contact layer Cc (FIG. 4b).

The lower detector element D2 is then formed by engraving of the layers Cc and D2; the engraving stops at the contact layer C2 (FIG. 4c).

The whole structure is then covered with a layer of insulator IS (FIG. 2).

Next, three holes are made in the layer of insulator to access the three contact layers; metal deposits are made in these holes to form the contact terminals P1, P2 and Pc.

For the fabrication of a matrix of detectors, the various detectors are made collectively as described previously. We then obtain a structure such that shown in FIG. 3b. As we have seen, the terminal P2 is common to the whole matrix. All that remains is therefore to make on the surface of the matrix the interconnecting conductors of the terminals P1, then the matrix of terminals Pc.

We have described above the invention making use of vertical transport detectors such as multi-quantum well detectors. We shall now describe the invention with horizontal transport detectors.

Figure 5:
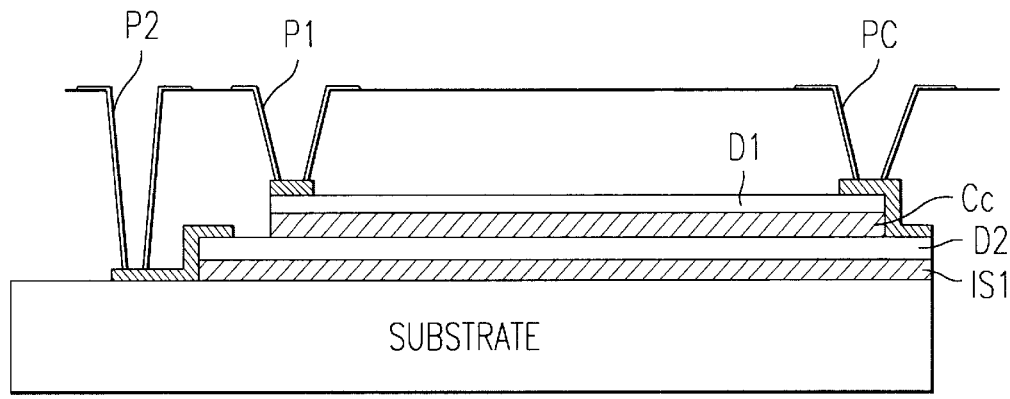
FIGS. 5 to 9 illustrate variants of the invention.

The detector is composed of two active layers separated by an insulating layer Cc (see FIG. 5).

Ohmic contacts are made at the two ends of each active layer D1, D2. At one of the ends of the detector, the ohmic contacts are made common to define the reading contact Pc. This contact Pc (one contact per pixel) will assure the connection with the input stage of the reading circuit. The lower contact P2 is connected to the active layer D2; the upper contact P1 is connected to the active layer D1. We therefore see that when the active layers are suitably polarized the detector operates in a similar manner to the one described previously, with the difference that the current circulates in the plane of the active layers instead of perpendicularly to the plane of the active layers.

In FIG. 5, an insulating layer IS1 is inserted between the active layer D2 and the substrate.

Figure 6:
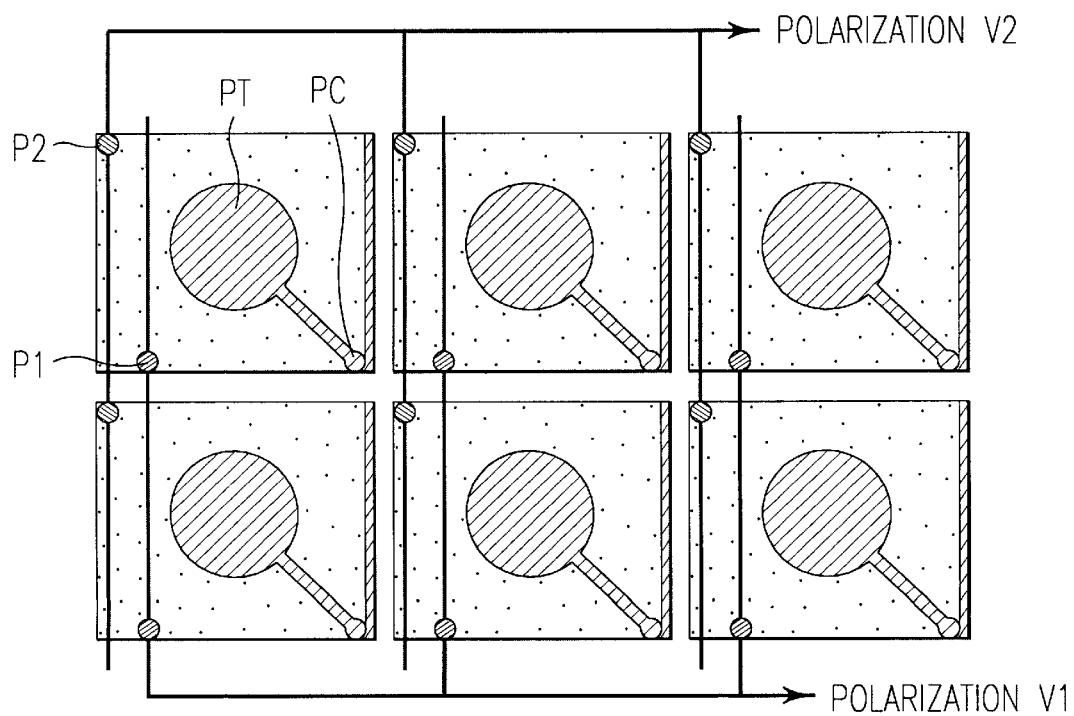

FIG. 6 shows a matrix organization of detectors such as those in FIG. 5. In this organization all the contacts P1 are connected to each other by column wires. The same applies for the contacts P2 and Pc. One central test terminal Pt per detector can be used to perform a current test.

Figure 7:
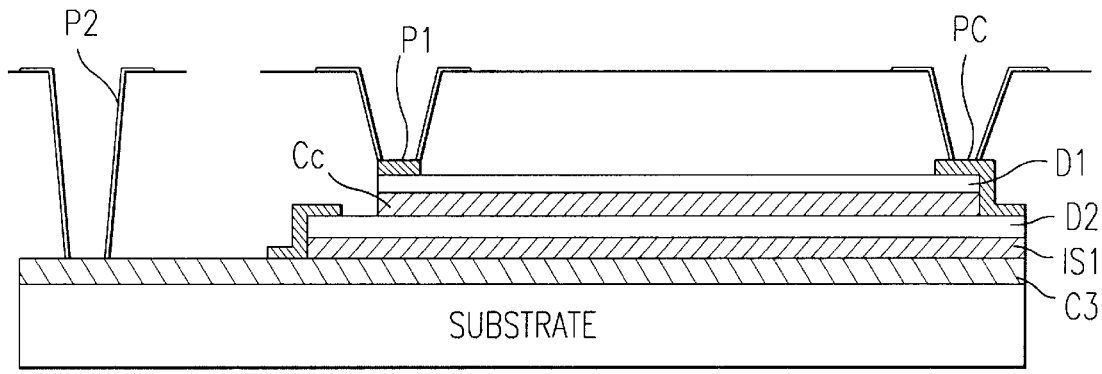

FIG. 7 shows a variant of the embodiment in FIG. 5 including a conducting layer C3 placed on the substrate and on which the structure in FIG. 5 is formed.

Figure 8:
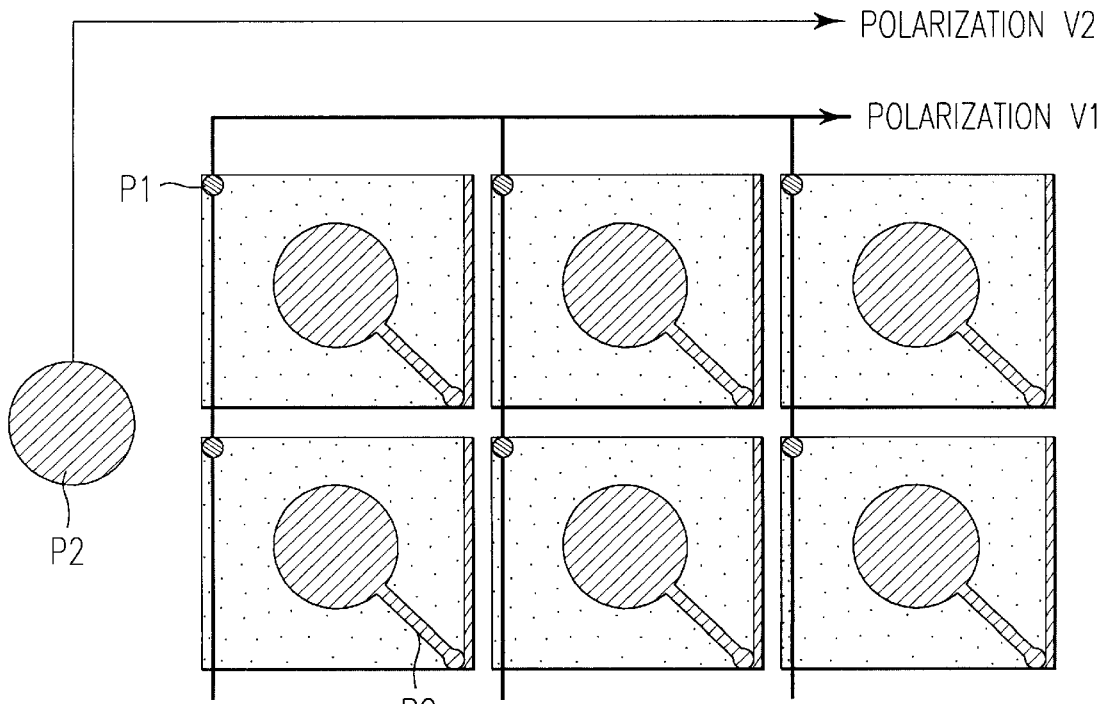

FIG. 8 shows a matrix organization of detectors of FIG. 7. In this matrix organization, the layer C3 enables a single terminal connection P2 to be used that is common to all the detector pixels.

Figure 9:
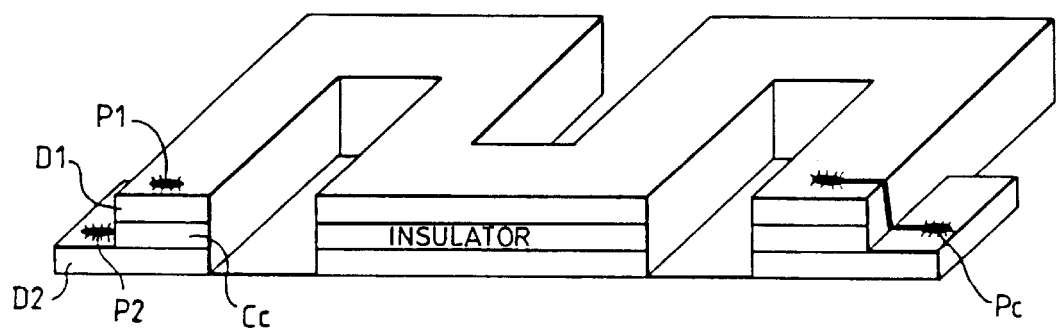

It will be clear to professionals of the art that there are additional possibilities of improvement while remaining within the framework of the invention:

inclusion of diffraction networks engraved on the top of the detector to minimize the thickness of the active layer and increase the detection sensitivity of the device; they also enable the responses of the two stages to be desymmetrized; use of a "serpentine" geometry (see FIG. 9) which increases the resistance of the pixel (by increasing the developed length and decreasing the equivalent electric surface without substantially changing the optical area); this geometry also provides some flexibility as regards metallurgical defects, since these then cause only local short-circuits.

What is claimed is:

1. An electromagnetic wave detector comprising:

a first detector element including an active photoconducting material capable of detecting a band of wavelength;

a second detector element including an active photoconducting material capable of detecting said band of wavelength;

a common contact layer positioned between said first and second detector elements;

a first connector configured to connect to said first detector element;

a second connector configured to connect to said second detector element;

a third connector configured to connect in common to said first and second detector elements;

contact mechanisms configured to apply control voltages to each of said connectors, the voltage applied to the third connector having a value between values applied to first and second connectors; and a reading circuit connected to said third connector and configured to read a photoconduction current difference between first and second detector element.

2. A detector according to claim 1, wherein:

said common contact layer is said third connector and is a common electrical contact layer;

said first and second detector elements are enclosed between a first electric control contact layer and a second electric control contact layer, said first and second connectors being said first and second electric control contact layers, respectively.

3. A detector according to claim 1, wherein:

said common contact layer is an insulating layer;

said third connector is connected to a first end of the first detector element and to a first end of the second detector element, said first connector is connected to a second end of the first detector element, and said second connector is connected to a second end of the second detector element, said first and second ends of each detector element being opposite ends of the corresponding detector element.

4. A detector according to claim 1, wherein the first detector element is capable of absorbing an amount of incident light in said band of wavelength greater than that of the second detector element.

5. A detector according to claim 1, wherein said common contact layer is not transparent to light corresponding to said band of wavelength so that one of said detector elements does not receive said light.

6. A detector according to claim 1, wherein one of said control voltages applied to said first and second connectors is an adjusted voltage such that the dark currents of the two detector elements are equal.

7. A detector according to claim 1, wherein one of said control voltages applied to said first and second connectors is an adjusted voltage such that the sums of a dark current and 3a background light-current of each of said first and second detector elements are equal to each other.

8. An electromagnetic wave detector comprising:

a substrate;

a common control contact layer;

a first contact mechanism configured to apply a control voltage to said common control contact layer;

a matrix of detectors, each comprising:

a first detector element including an active photoconducting material capable of detecting a band of wavelength, said first detector element being positioned on said common control contact layer, a second detector element including an active photoconducting material capable of detecting said band of wavelength, an electrical contact reading layer positioned between said first and second detector elements, a control contact layer positioned on said second detector element, and second and third contact mechanisms configured to apply control voltages to said electrical contact reading layers and said control contact layers respectively; and a reading circuit connected to one of said electrical contact reading layers and configured to read a photoconduction current difference between said first and second detector elements of one of said matrix of detectors having said one of said electrical contact reading layers;

wherein control contact layers of said second detector elements are connected to each other.

9. A detector according to claim 2, further comprising:

a matrix of line conductors and column conductors superposed on said matrix of detectors, each detector being located substantially at an intersection of the matrix of line conductors and column conductors and being connected to a corresponding column conductor at the intersection via a switching device controlled by a voltage applied to a corresponding line conductor at the intersection.

10. A detector according to claim 8, wherein:

said common control contact layer comprises a plurality of strips, a row of detectors being made on each strip;

said control contact layers of the detectors of each row of detectors are interconnected; and said electrical contact reading layer of one detector of each row of detectors are interconnected to each other through a switching device to form a column of detectors.

11. An electromagnetic wave detector comprising:

a substrate;

a common conducting layer;

an insulating layer covering the common conducting layer;

a first contact mechanism configured to apply a control voltage to said common conducting layer;

a matrix of detectors, each comprising:

a first detector element including an active photoconducting material capable of detecting a band of wavelength, said first detector element being positioned on said insulating layer, a second detector element including an active photoconducting material capable of detecting said band of wavelength, an insulating layer positioned between said first and second detector elements, a first connector configured to connect to said first detector element, a second connector configured to connect to said second detector element, a third connector configured to connect to both first and second detector elements, and second and third contact mechanisms configured to apply control voltages to said second and third connectors; and a reading circuit connected to said third connector and configured to read a photoconduction current difference between said first and second detector elements of one of said matrix of detectors;

wherein the first connectors of the detectors are interconnected; and the second connectors of the detectors are interconnected.

* * * * *